(12) United States Patent
Wang et al.

(10) Patent No.: US 9,070,699 B2
(45) Date of Patent: Jun. 30, 2015

(54) MICROMACHINED STRUCTURES

(75) Inventors: Chuanwei Wang, Hsin-Chu (TW); Ming Han Tsai, Hsin-Chu (TW); Chih Ming Sun, Hsin-Chu (TW); Weileun Fang, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 606 days.

(21) Appl. No.: 13/343,187

(22) Filed: Jan. 4, 2012

(65) Prior Publication Data
US 2012/0107545 A1 May 3, 2012

Related U.S. Application Data

(63) Continuation of application No. 11/944,317, filed on Nov. 21, 2007, now Pat. No. 8,105,498.

(30) Foreign Application Priority Data

Oct. 23, 2007 (TW) .............................. 96139618 A

(51) Int. Cl.
*H01L 21/00* (2006.01)
*H01L 49/02* (2006.01)
*H01L 29/84* (2006.01)

(52) U.S. Cl.
CPC .............. *H01L 28/60* (2013.01); *Y10T 428/22* (2015.01); *H01L 29/84* (2013.01)

(58) Field of Classification Search
CPC ....................... H01L 29/84; H01L 2924/1461

USPC ............................. 438/50, 51, 52, 53; 216/17
See application file for complete search history.

(56) References Cited

U.S. PATENT DOCUMENTS

| | | | |
|---|---|---|---|
| 6,514,860 B1 | 2/2003 | Okada et al. | |
| 6,525,395 B1 * | 2/2003 | Kawase et al. | 257/528 |
| 6,662,654 B2 | 12/2003 | Miao et al. | |
| 6,712,983 B2 * | 3/2004 | Zhao et al. | 216/2 |
| 6,936,492 B2 | 8/2005 | McNeil et al. | |
| 8,105,498 B2 * | 1/2012 | Wang et al. | 216/57 |
| 2006/0046482 A1 | 3/2006 | Verhaverbeke | |
| 2007/0275565 A1 | 11/2007 | Cooney, III et al. | |
| 2008/0233752 A1 * | 9/2008 | Ko et al. | 438/700 |

OTHER PUBLICATIONS

Chuanwei Wang, "A novel CMOS out-of-plane accelerometer with fully differential gap-closing capacitance sensing electodes", Journal of Micromechanics and Microengineering, May 10, 2007, pp. 1-6.

* cited by examiner

*Primary Examiner* — Reema Patel
(74) *Attorney, Agent, or Firm* — Lowe Hauptman & Ham, LLP

(57) ABSTRACT

A micromachined structure includes a substrate and a suspended structure. The substrate has a cavity formed thereon. The suspended structure is formed on the cavity of the substrate. The suspended structure includes a first metal layer, a second metal layer, and a first dielectric layer positioned between the first and second metal layers, wherein the first dielectric layer has a first opening in communication with the cavity through an opening formed in the first metal layer.

18 Claims, 3 Drawing Sheets

MICROMACHINED STRUCTURES

CROSS REFERENCE TO RELATED APPLICATION

This application is a continuation application of U.S. Ser. No. 11/944,317 filed Nov. 21, 2007, the full disclosure of which is incorporated herein by reference.

BACKGROUND OF THE INVENTION

1. Field of the Invention

The invention relates to micromachined structures, and more particularly, to micromachined structures fabricated with wet etching process.

2. Description of the Related Art

Microfabrication, also known as micromachining, commonly refers to the use of known semiconductor processing techniques to fabricate devices known as micro-electromechanical systems (MEMS) or micromachined devices. In general, known MEMS fabrication processes involve the sequential addition and removal of layers of material from a substrate layer through the use of film deposition and etching techniques until the desired structure has been realized. Accordingly, MEMS devices typically function under the same principles as their macroscale counterparts. MEMS devices, however, offer advantages in design, performance, and cost in comparison to their macroscale counterparts due to the decrease in scale of MEMS devices. In addition, due to batch fabrication techniques applicable to MEMS technology, significant reductions in per unit cost may be realized.

Micromachined structures are frequently used in MEMS inertial sensors, such as accelerometers and gyroscopes. A MEMS accelerometer using differential capacitors to detect acceleration typically includes three primary micromachined elements: a central, or proof mass, capacitor plates, and springs. FIG. 1 is a top plan view of a typical prior differential capacitor-based micromachined accelerometer 100, including a movable proof mass 102 supported by spring support beams 104. The proof mass 102 includes a plurality of electrodes 108 extending perpendicularly away from the proof mass 102, which are interleaved with a plurality of electrodes 110 extending perpendicularly from support beams 112. These features are formed in a cavity 116 formed in a substrate 118 through conventional etching techniques, and may be anchored to the underlying substrate 118 or cantilevered structures released from the substrate 118. The electrodes 108 and 110 are typically made of polysilicon or a material comprised of multi-films, such as silicon dioxide or aluminum, thereby creating individual parallel-plate capacitors between each adjacent pair of the interleaved electrodes 108, 110. In operation, when the accelerometer 100 is accelerated, the electrodes 108 move relative to the electrodes 110, thereby varying the distance, and hence the capacitance, between the electrodes 108, 110. The variable capacitance can be determined by peripheral circuitry interfacing with connectors 120, which are connected to the electrodes 110 via the support beams 112.

It is known, however, to use CMOS-micromachining processes to create microstructures that are made out of the dielectric and metallization layers in a CMOS process. According to such processes, one of the CMOS interconnect metal layers, or some other layer made from an etch-resistant mask material, acts as an etch-resistant mask for defining the microstructural sidewalls. A reactive-ion etch of the CMOS oxide layer creates composite metal/dielectric microstructures that can have a high aspect ratio of beam width to beam thickness, and of gaps between the beams to beam thickness.

According to standard CMOS process for fabricating MEMS devices, the COMS-MEMS process can be classified into three sub-processes, i.e. pre-CMOS process, intermediate-CMOS and post-CMOS process.

According to the pre-CMOS process, a MEMS structure is first defined. An etching stop layer is then used to protect the standard CMOS components. The advantage of such design is that the CMOS components can be free from the influence of temperature and etching during the formation of the MEMS structure. A typical process is that polysilicon is first deposited to form the MEMS structure and a layer of silicon oxide is then used to cover the CMOS components. Afterward, the layer of silicon oxide is ground flush with the technique of chemical mechanical polish (CMP). After the layer of silicon oxide is ground flush, a second stage of CMOS process is performed to fabricate circuit components. Finally, the silicon oxide is etched to release elements to form the monolithic integration of the IC and MEMS components.

According to the intermediate-CMOS process, the original process parameters are varied or the original standard CMOS process is modified to add layers of material to form the desired microstructure. However, the COMS foundries usually do not allow their clients to change the process parameters. Therefore, only those with their own foundries can change the process parameters at their own choice.

According to the post-CMOS process, the structure and CMOS process are achieved simultaneously. After the CMOS process is achieved, the MEMS structure is suspended. Alternatively, the related component processes such as electroplating or etching can be carried out after the CMOS process.

In general, the conventional post CMOS-MEMS process can only achieve vertical etching and fails to etch out a horizontal channel as the gap between the upper and lower electrodes. Therefore, most of the existing capacitor-based in-plane micromachined accelerometers are fabricated with the conventional CMOS-MEMS process. However, such accelerometers of parallel vertical comb sensing electrodes can only induce a small variation of the capacitance between the electrodes and also have high residual stress. This will cause the existing micromachined accelerometers to have poor performance.

Accordingly, there exists a need to provide a method for fabricating variable parallel plate capacitors to solve the above-mentioned problems.

SUMMARY OF THE INVENTION

It is an object of the present invention to provide a method for fabricating micromachined structures that have the characteristics of the sub-micron gap formed by wet etching.

In one embodiment, the method for fabricating micromachined structures according to the present invention comprises the steps of: a. providing a substrate; b. forming a fourth dielectric layer on the substrate; c. forming a first metal layer on the fourth dielectric layer; d. forming a first dielectric layer on the first metal layer, wherein the first dielectric layer has a first via; e. forming a second metal layer on the first dielectric layer; f. forming a second dielectric layer on the second metal layer, wherein the second dielectric layer has a second via; g. forming a third metal layer on the second dielectric layer; h. forming a third dielectric layer on the third metal layer, wherein the third dielectric layer has a third via; i. forming a fourth metal layer on the third dielectric layer; j. forming a passivation layer on the fourth metal layer; k. forming an etching window in the passivation layer; l. pouring an etching solution into the etching window, wherein the etching solution will flow through the first, second and third vias to conduct a wet etching process; m. removing the etching solution; n. removing the passivation layer; and o. etching the substrate to form a micromachined structure.

In another embodiment, the method for fabricating micromachined structures according to the present invention comprises the steps of: a. forming a structure having a dielectric layer, a metal layer and a passivation layer, wherein the dielectric layer has a via; b. forming an etching window in the passivation layer; c. pouring an etching solution into the etching window, wherein the etching solution will flow through the via to conduct a wet etching process; d. removing the etching solution; e. removing the passivation layer; and f. etching the structure to form a micromachined structure.

In further embodiment, the method for fabricating micromachined structures according to the present invention comprises the steps of: a. forming a circuitry layer having a plurality of dielectric layers, a plurality of vias in the dielectric layers, a plurality of metal layers and a passivation layer, wherein the passivation layer has an etching window; b. pouring an etching solution into the etching window, wherein the etching solution will flow through the vias to conduct a wet etching process; c. removing the passivation layer; and d. etching the circuitry layer to form a micromachined structure.

In another further embodiment, the method for fabricating micromachined structures according to the present invention comprises the steps of: a. forming a circuitry layer having a path of wet etching and a passivation layer, wherein the passivation layer has an etching window; b. pouring an etching solution into the etching window, wherein the etching solution will flow along the path of wet etching to conduct a wet etching process; c. removing the passivation layer; and d. etching the circuitry layer to form a micromachined structure.

The present invention further provides micromachined structures fabricated by the above method.

In on embodiment, the micromachined structure according to the present invention includes a substrate and a suspended structure. The substrate has a cavity formed thereon. The suspended structure is formed on the cavity of the substrate. The suspended structure includes a first metal layer, a second metal layer, and a first dielectric layer positioned between the first and second metal layers, wherein the first dielectric layer has a first opening in communication with the cavity through an opening formed in the first metal layer.

In another embodiment, the micromachined structure according to the present invention includes a substrate and a circuitry layer. The substrate has a cavity formed thereon. The circuitry layer is formed on the cavity of the substrate. The circuitry layer includes a plurality of dielectric layers and a plurality of metal layers. Each of the dielectric layers is positioned between two of the metal layers, wherein each the dielectric layer has an opening in communication with the cavity through at least one opening formed in the metal layers.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

The method for fabricating micromachined structures according to the present invention includes two stages, wherein the first stage is the CMOS process and the second stage is the post fabrication process for suspending a portion of the MEMS components.

Figure 1:
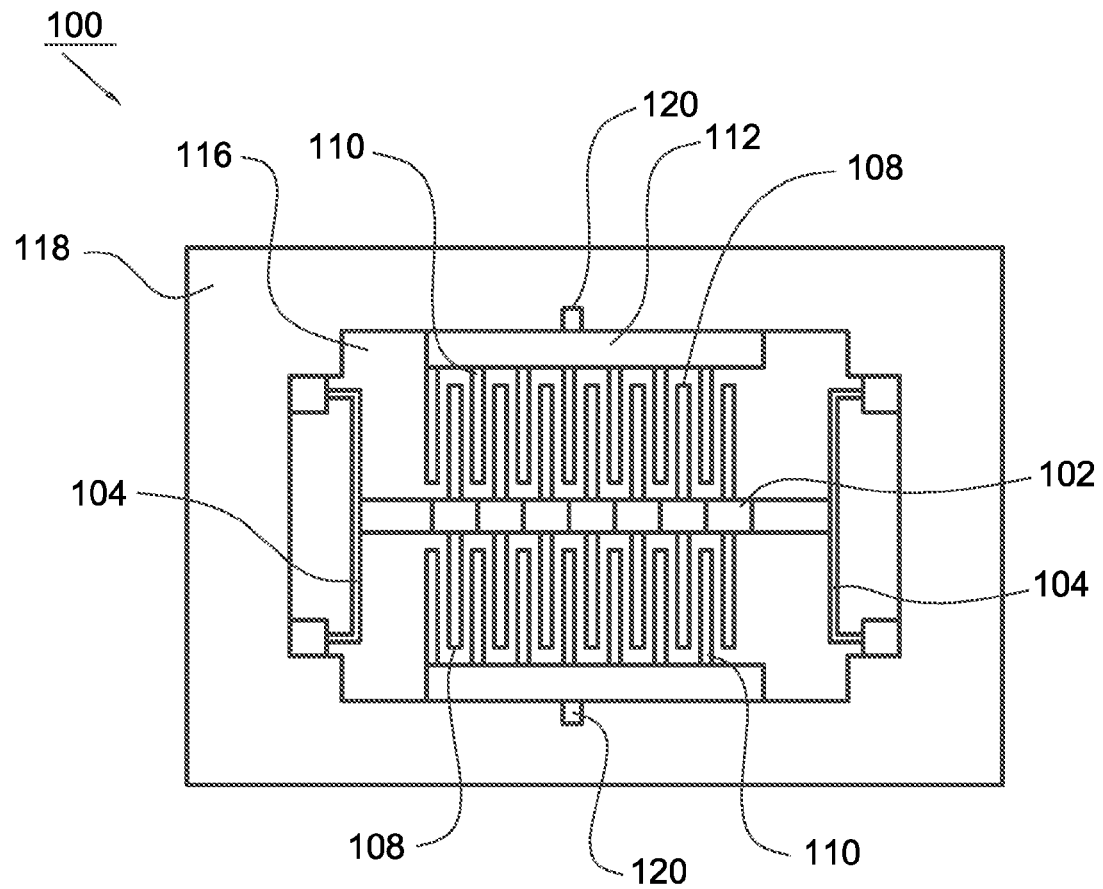
FIG. 1 is a top plan view of a typical prior differential capacitor-based micromachined accelerometer
Figure 2:
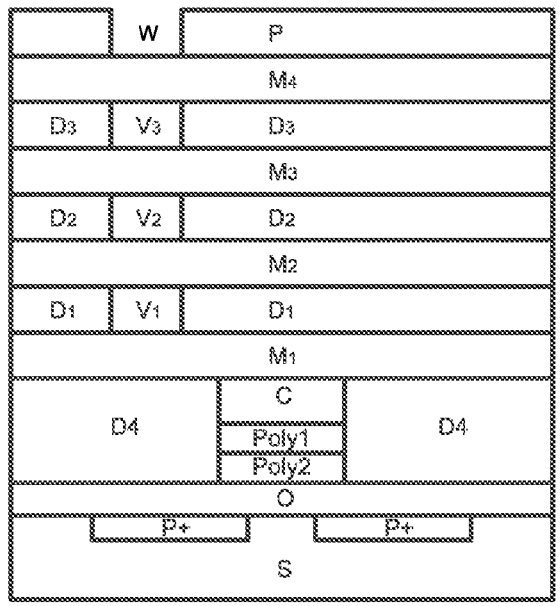
FIG. 2 is a side view of the micromachined structure formed according to the first stage of the method for fabricating micromachined structures of the present invention.

Referring to FIG. 2, it illustrates a side view of the micromachined structure which is formed according to the first stage of the method for fabricating micromachined structures of the present invention. As shown in the figure, the micromachined structure 200 formed in the first stage includes a substrate S, two polysilicon layers (poly1 and poly2), thermal silicon oxide layer O, a first dielectric layer D1, a second dielectric layer D2, a third dielectric layer D3, a fourth dielectric layer D4, a first metal layer M1, a second metal layer M2, a third metal layer M3, a fourth metal layer M4, a contact layer C, an active region P+ and a passivation layer P. In this embodiment, polysilicon layers poly1 and poly2 respectively have a thickness of 0.15 µm, the fourth dielectric layer D4 has a thickness of 1.2 µm and the dielectric layers D1, D2 and D3 respectively have a thickness of 1 µm. The metal layers M1, M2, M3 and M4 are all made of aluminum and have a thickness of 0.66 µm, 0.64 µm, 0.64 µm and 0.925 µm, respectively. The vias V1, V2 and V3 formed in the dielectric layers D1, D2 and D3 respectively are all made of tungsten.

Prior to the CMOS process, an N-well is formed to first define a PMOS region and then the range of the active region. The purpose is to mark the position of the PMOS and then achieve a P-type ion implant. The thermal silicon oxide layer or named field silicon oxide O is formed on the active region P+. Subsequently, the polysilicon layers poly1 and poly2 are deposited on the thermal silicon oxide O to form capacitors. After the structure are defined, to make electrical signal able to be routed well, the metal layers M1, M2, M3 and M4, dielectric layers D1, D2, D3 and D4 are deposited on the thermal silicon oxide O and the vias V1, V2 and V3 are formed in the dielectric layers D1, D2 and D3 respectively to make the metal layers M1, M2, M3 electrically conducted to each other. After the final metal layer M4 is deposited, the passivation layer P is deposited on the metal layer M4 to protect the structure assembly beneath. In order to be able to successfully implement the subsequent wet process, the vias V1, V2 and V3 are designed respectively to have a depth of 0.5 µm and a width dependent on the structure. Besides, the positions of the vias V1, V2 and V3 are also dependent on the desired path of wet etching. It is to be noted that an etching window W is required to be formed in the passivation layer P so that the wet etching can be achieved by pouring etching solution to the window W. In this embodiment, silicon oxide and/or silicon nitride can be used to form the passivation layer P and the dielectric layers D1, D2 and D3 are made of silicon dioxide. It should be understood that the micromachined structure 200 of the FIG. 2 is to be considered an exemplification of the invention and is not intended to limit the invention to the specific embodiment illustrated.

Figure 3:
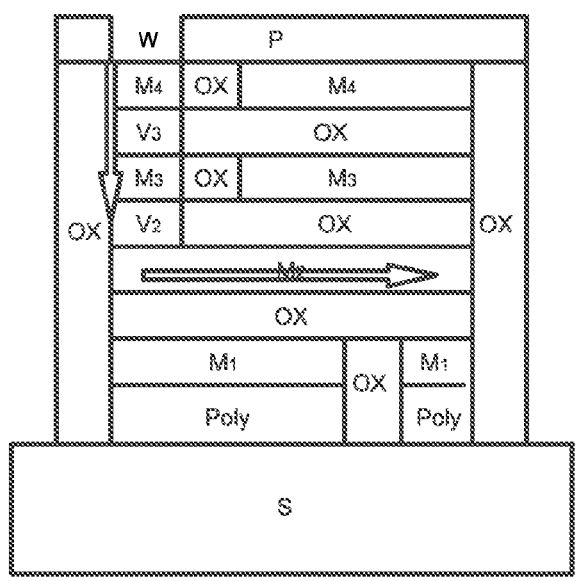
FIG. 3 is another side view of the micromachined structure formed according to the first stage of the method for fabricating micromachined structures of the present invention.

Referring to FIG. 3, it illustrates another side view of the micromachined structure which is formed according to the first stage of the method for fabricating micromachined structures of the present invention. As shown in the figure, when the etching solution comprised of sulfuric acid ($H_2SO_4$) and hydrogen peroxide ($H_2O_2$) is poured to the etching window W to conduct the wet etching process, it will flow along the arrow directions to etch out portions of the metal layers M1, M2, M3 and M4 and the tungsten in the vias V1, V2 and V3. Since the solution of the sulfuric acid and hydrogen peroxide has a high selectivity for a silicon dioxide over metal, the silicon dioxide layer can be used as an etch-resistant layer to protect the micromachined structure. Besides, because the dielectric layers D1, D2, D3 and D4 are all made of silicon dioxide in this embodiment, they are denoted by the same reference character OX in the FIG. 3. Basically, the vias V1, V2 and V3 in this embodiment is required to enclose the path of wet etching so as to suspend the silicon dioxide enclosed by the vias V1, V2 and V3. After the vias V1, V2 and V3 are etched, the suspended silicon dioxide blocks will be brought out by the etching solution. Through the design of the path of wet etching to remove the desired portion of the metal layers, the method for fabricating micromachined structures according to the present invention can achieve horizontal etching that cannot be achieved by conventional dry etching techniques. Therefore, the flexibility in designing the micromachined structures can be increased remarkably. The wet etching process of the present invention can be used to form a fully differential type sensing structure of sub-micron gap that has better performance than the conventional parallel vertical comb sensing structure.

Figure 4A:
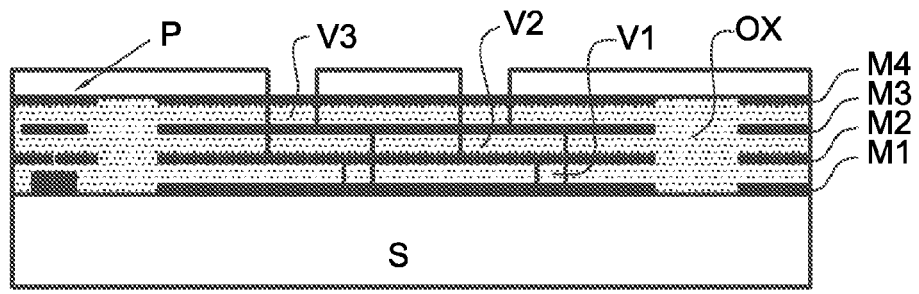
FIGS. 4A to 4D illustrate the method for fabricating micromachined structures according to present invention.
Figure 4B:
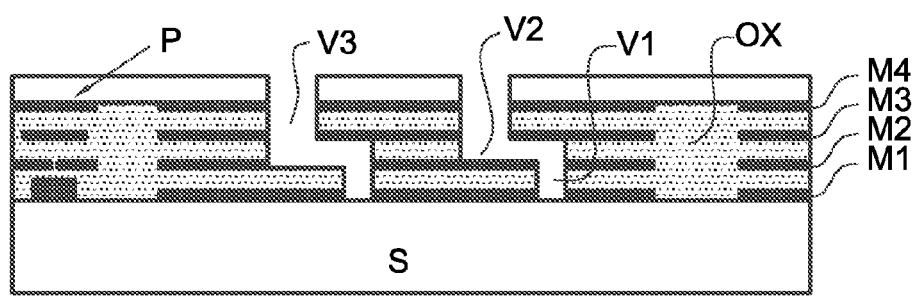

Referring to FIGS. 3 and 4A to 4D, wherein FIGS. 4A to 4D illustrate the method for fabricating micromachined structures. As shown in FIGS. 3 and 4A to 4B, the etching solution flows through the etching window W and then etches out the tungsten in the vias V1, V2 and V3. The wet etching process is conducted at a temperature of 85° C. and the hydrogen peroxide is replenished during the wet etching process. However, the wet etching process can be conducted at a temperature different from 85° C. The increase in temperature can expedite the etching process. After all materials in the path of wet etching have been removed out, the resulting structure is put in pure water to remove the sulfuric acid in the etching solution and then put in the isopropanol (IPA) to remove the pure water. Finally, the resulting structure 200 is heated to evaporate the isopropanol.

Figure 4C:
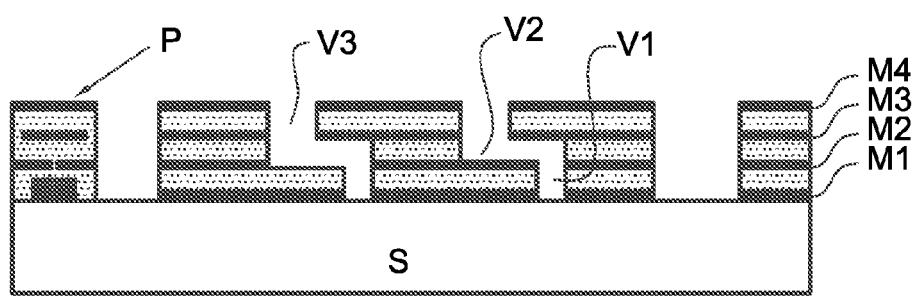

After the wet etching process is finished, a subsequent dry wet process is conducted. Referring to FIG. 4C, a reactive ion etching (RIE) process is employed to remove the passivation and portions of the dielectric layers D1, D2 and D3. In this process, the top metal layer (metal layer M4) acts as the etching mask so that only those portions of the dielectric layers D1, D2 and D3 exposed by the metal layer M4 are removed. After the dry etching process is finished, it is required to put the resulting structure in a dry environment to avoid the growth of native silicon oxide layer on the silicon substrate S to affect the performance of subsequent process.

Figure 4D:
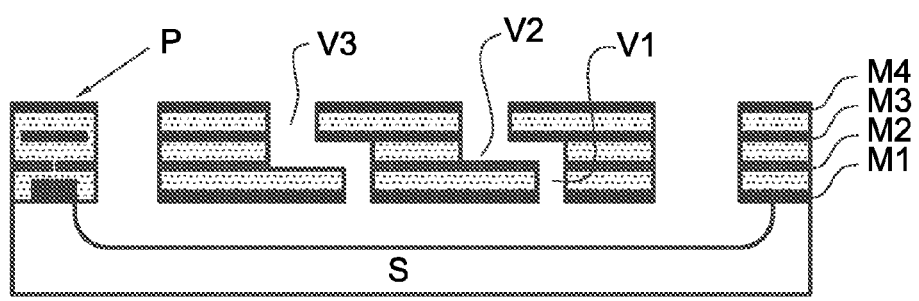

Referring to FIG. 4D, the last process is also a dry etching process. In this process, an ionized $XeF_2$ gas is injected to etch the substrate S. Alternatively, an inductively coupled plasma (ICP) can be employed to etch the substrate S.

In summary, the metal layers and vias according to the present invention can together form a path of wet etching. Through the design of the path of wet etching, a sensing structure of sub-micron gap can be obtained. The design of the path of wet etching according to the present invention can be used to form the sensors with two separate upper and lower structures, such as pressure sensors, microphone and the upper and lower electrodes of out-of-plane accelerometers.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A micromachined structure, comprising:
    a substrate having a cavity formed thereon, wherein the substrate defines a horizontal direction parallel to a surface thereof; and
    a suspended structure formed on the cavity of the substrate, the suspended structure comprising
        a first metal layer,
        a second metal layer,
        a first dielectric layer positioned between the first and second metal layers,
        a second dielectric layer disposed on the second metal layer,
        a third metal layer disposed on the second dielectric layer, and
        a third dielectric layer disposed on the third metal layer,
    wherein
        the first dielectric layer has a first opening in communication with the cavity through an opening formed in the first metal layer,
        the second dielectric layer has a second opening in communication with the first opening through an opening formed in the second metal layer,
        the third dielectric layer has a third opening in communication with the second opening through an opening formed in the third metal layer, and
        the second opening has a second width in the horizontal direction, the third opening has a third width in the horizontal direction, and the second width is greater than the third width.

2. The micromachined structure as claimed in claim 1, wherein the first opening has a first width in the horizontal direction, and the second width is greater than the first width.

3. The micromachined structure as claimed in claim 1, wherein
    the substrate further defines a vertical direction perpendicular to the horizontal direction, and
    the third opening is free of overlapping with the first opening in the vertical direction.

4. The micromachined structure as claimed in claim 1, wherein the opening of the first metal layer has a width in the horizontal direction smaller than the second width.

5. The micromachined structure as claimed in claim 1, wherein the opening of the third metal layer has a width in the horizontal direction smaller than the second width.

6. The micromachined structure as claimed in claim 1, further comprising:
    a fourth metal layer disposed on the third dielectric layer, wherein the fourth metal layer has an opening in communication with the opening of the third metal layer through the third opening.

7. The micromachined structure as claimed in claim 6, wherein the opening of the fourth metal layer has a width in the horizontal direction smaller than the second width.

8. The micromachined structure as claimed in claim 6, wherein
    the substrate further defines a vertical direction perpendicular to the horizontal direction, and
    the opening of the fourth metal layer is free of overlapping with the opening of the first metal layer in the vertical direction.

9. The micromachined structure as claimed in claim 1, wherein the substrate further defines a vertical direction perpendicular to the horizontal direction, and the opening of the third metal layer is free of overlapping with the opening of the first metal layer in the vertical direction.

10. A micromachined structure, comprising:

a substrate having a cavity formed thereon, wherein the substrate defines a horizontal direction parallel to a surface thereof; and a circuitry layer formed on the cavity of the substrate, the circuitry layer comprising a plurality of dielectric layers and a plurality of metal layers, wherein each dielectric layer of the plurality of dielectric layers is positioned between two adjacent metal layers of the plurality of metal layers, and each dielectric layer of the plurality of dielectric layers has an opening in communication with the cavity through at least one opening formed in the plurality of metal layers, wherein the plurality of the dielectric layers at least comprises first, second and third dielectric layers, the second dielectric layer is positioned between the first and third dielectric layers, and the opening of the second dielectric layer has a width that is greater than widths of the openings of the first and third dielectric layers in the horizontal direction.

11. A micromachined structure, comprising:

a substrate having a cavity formed thereon, wherein the substrate defines a horizontal direction parallel to a surface thereof and a vertical direction perpendicular to the horizontal direction; and a suspended structure formed on the cavity of the substrate, the suspended structure comprising a first metal layer, a second metal layer, a first dielectric layer positioned between the first and second metal layers, a second dielectric layer disposed on the second metal layer, a third metal layer disposed on the second dielectric layer, and a third dielectric layer disposed on the third metal layer, wherein the first dielectric layer has a first opening in communication with the cavity through an opening formed in the first metal layer, the first opening having a first width in the horizontal direction, the second dielectric layer has a second opening in communication with the first opening through an opening formed in the second metal layer, the second opening having a second width in the horizontal direction, the third dielectric layer has a third opening in communication with the second opening through an opening formed in the third metal layer, and the third opening is free of overlapping with the first opening in the vertical direction.

12. The micromachined structure as claimed in claim 11, wherein the second width is greater than the first width.

13. The micromachined structure as claimed in claim 11, wherein the opening of the first metal layer has a width in the horizontal direction smaller than the second width.

14. The micromachined structure as claimed in claim 11, wherein the opening of the third metal layer has a width in the horizontal direction smaller than the second width.

15. The micromachined structure as claimed in claim 11, further comprising:

a fourth metal layer disposed on the third dielectric layer, wherein the fourth metal layer has an opening in communication with the opening of the third metal layer through the third opening.

16. The micromachined structure as claimed in claim 15, wherein the opening of the fourth metal layer has a width in the horizontal direction smaller than the second width.

17. The micromachined structure as claimed in claim 15, wherein the opening of the fourth metal layer is free of overlapping with the opening of the first metal layer in the vertical direction.

18. The micromachined structure as claimed in claim 11, wherein the opening of the third metal layer is free of overlapping with the opening of the first metal layer in the vertical direction.

* * * * *